(12) United States Patent
Ogawa et al.

(10) Patent No.: US 8,987,645 B2
(45) Date of Patent: Mar. 24, 2015

(54) SUBSTRATE PROCESSING APPARATUS HAVING ROTATABLE SLOT-TYPE ANTENNA AND METHOD OF MANUFACTURING SEMICONDUCTOR DEVICE USING THE SAME

(75) Inventors: Unryu Ogawa, Toyama (JP); Masahisa Okuno, Toyama (JP); Tokunobu Akao, Toyama (JP); Shinji Yashima, Toyama (JP); Atsushi Umekawa, Toyama (JP); Kaichiro Minami, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 147 days.

(21) Appl. No.: 13/240,545

(22) Filed: Sep. 22, 2011

(65) Prior Publication Data

US 2012/0129358 A1 May 24, 2012

(30) Foreign Application Priority Data

Nov. 19, 2010 (JP) .................................. 2010-258902
Jul. 8, 2011 (JP) .................................. 2011-151654

(51) Int. Cl.
| | | |
|---|---|---|
| H05B 6/68 | (2006.01) | |
| H05B 6/64 | (2006.01) | |
| H01L 21/67 | (2006.01) | |
| H01L 21/687 | (2006.01) | |
| H05B 6/80 | (2006.01) | |

(52) U.S. Cl.
CPC .... *H01L 21/67109* (2013.01); *H01L 21/67115* (2013.01); *H01L 21/6875* (2013.01); *H05B 6/806* (2013.01)
USPC ........... 219/757; 219/678; 219/756; 438/795; 700/121

(58) Field of Classification Search
CPC .................. H01L 21/67115; H01L 21/67109; H01L 21/6875; H05B 6/806
USPC ............................ 438/795; 700/121; 219/678
See application file for complete search history.

(56) References Cited

U.S. PATENT DOCUMENTS

| | | | | |
|---|---|---|---|---|
| 2004/0089631 | A1* | 5/2004 | Blalock et al. | 216/69 |
| 2007/0224839 | A1* | 9/2007 | Shimizu | 438/795 |
| 2010/0089871 | A1* | 4/2010 | Ishikawa et al. | 216/70 |

FOREIGN PATENT DOCUMENTS

| | | |
|---|---|---|
| JP | 05-47468 A | 2/1993 |
| JP | 05-242997 A | 9/1993 |
| JP | 07-296990 A | 11/1995 |

(Continued)

*Primary Examiner* — Peter Bradford
(74) *Attorney, Agent, or Firm* — Volpe and Koenig, P.C.

(57) ABSTRACT

Provided are a substrate processing apparatus and a method of manufacturing a semiconductor device that are capable of uniformly heating a substrate while reducing an increase in substrate temperature to reduce a thermal budget. The substrate processing apparatus includes a process chamber configured to process a substrate; a substrate support unit installed in the process chamber to support the substrate; a microwave supply unit configured to supply a microwave toward a process surface of the substrate supported by the substrate support unit, the microwave supply unit including a microwave radiating unit radiating the microwave supplied from a microwave source to the process chamber while rotating; a partition installed between the microwave supply unit and the substrate support unit; a cooling unit installed at the substrate support unit; and a control unit configured to control at least the substrate support unit, the microwave supply unit and the cooling unit.

4 Claims, 4 Drawing Sheets

(56) References Cited

FOREIGN PATENT DOCUMENTS

| JP | 2004296820 A | 10/2004 |
| JP | 2007-258286 A | 10/2007 |
| JP | 2008-306176 A | 12/2008 |
| KR | 10-2007-0108929 A | 11/2007 |

\* cited by examiner

US 8,987,645 B2

SUBSTRATE PROCESSING APPARATUS HAVING ROTATABLE SLOT-TYPE ANTENNA AND METHOD OF MANUFACTURING SEMICONDUCTOR DEVICE USING THE SAME

CROSS-REFERENCE TO RELATED PATENT APPLICATION

This U.S. non-provisional patent application claims priority under 35 U.S.C. §119 of Japanese Patent Application No. 2010-258902 filed on Nov. 19, 2010, and No. 2011-151654 filed on Jul. 8, 2011, in the Japanese Patent Office, the entire contents of which are hereby incorporated by reference.

BACKGROUND OF THE INVENTION

1. Field of the Invention

The present invention relates to a substrate processing technique for manufacturing a semiconductor device such as an integrated circuit (IC) on a substrate, and more particularly, to a semiconductor manufacturing apparatus for manufacturing a semiconductor device by processing a substrate such as a semiconductor wafer (hereinafter referred to as a "wafer") using microwaves, a substrate processing apparatus for processing the substrate, and a method of manufacturing the semiconductor device.

2. Description of the Related Art

One semiconductor manufacturing process, a chemical vapor deposition (CVD) process, is provided to perform a predetermined film-forming process on a surface of a substrate (a substrate to be processed) having a fine electric circuit pattern and formed of a silicon wafer, glass, or the like as a base. In the CVD process, a substrate is loaded into a sealed reaction chamber, the substrate is heated by a heating unit installed in the reaction chamber, and a film-forming gas is supplied on the substrate to cause a chemical reaction, and thus a thin film is uniformly formed on a fine electric circuit pattern installed on the substrate. According to the CVD process, for example, an organic chemical material may be used as a film-forming source to form a hafnium oxide (HfO) film, a zirconium oxide (ZrO) film, or the like, which is a high-k film acting as a high dielectric constant insulating film.

In order to stabilize the formed high-k film, the substrate should be annealed. However, when a thermal budget is accumulated during the heating, a bad influence may be exerted on the organic chemical material when a heat-sensitive material is formed on the substrate.

The following patent document 1 discloses a technique of forming a thin film including hafnium on a substrate during a film forming process, and removing impurities from the film formed by the film forming process by supplying an argon radical on the substrate during a modifying process.

RELATED ART DOCUMENT

Patent Document 1

1. Japanese Patent Laid-open Publication No. 2004-296820

SUMMARY OF THE INVENTION

In order to solve the problems, an object of the present invention is to provide a substrate processing apparatus and a method of manufacturing a semiconductor device that are capable of uniformly heating a substrate while reducing an increase in temperature of the substrate to reduce a thermal budget.

The present invention is provided to reduce a thermal budget of a substrate by heating and modifying a dielectric substance on the substrate using microwaves and cooling the substrate. A typical configuration of the substrate processing apparatus in accordance with the present invention is as follows.

A substrate processing apparatus including: a process chamber configured to process a substrate; a substrate support unit installed in the process chamber to support the substrate; a microwave supply unit configured to supply a microwave toward a process surface of the substrate supported by the substrate support unit, the microwave supply unit including a microwave radiating unit radiating the microwave supplied from a microwave source to the process chamber while rotating; a partition installed between the microwave supply unit and the substrate support unit; a cooling unit installed at the substrate support unit; and a control unit configured to control at least the substrate support unit, the microwave supply unit and the cooling unit.

A method of manufacturing a semiconductor device using a substrate processing apparatus including: a process chamber configured to process a substrate; a substrate support unit installed in the process chamber to support the substrate; a microwave supply unit configured to supply a microwave toward a process surface of the substrate supported by the substrate support unit, the microwave supply unit including a microwave radiating unit radiating the microwave supplied from a microwave source to the process chamber while rotating; a partition installed between the microwave supply unit and the substrate support unit; a cooling unit installed at the substrate support unit; an inert gas supply unit configured to supply an inert gas into the process chamber, and a control unit configured to control at least the substrate support unit, the microwave supply unit, the cooling unit, and the inert gas supply unit, the method including: placing the substrate on the substrate support unit and supplying the inert gas from the inert gas supply unit; rotating the microwave radiating unit and supplying the microwave into the process chamber after supplying the inert gas; and stopping supplying the microwave after the microwave is supplied.

As a substrate processing apparatus and a method of manufacturing a semiconductor device are configured as described above, a substrate can be heated while reducing an increase in temperature of the substrate to reduce a thermal budget.

DETAILED DESCRIPTION OF THE PREFERRED EMBODIMENTS

Figure 1:
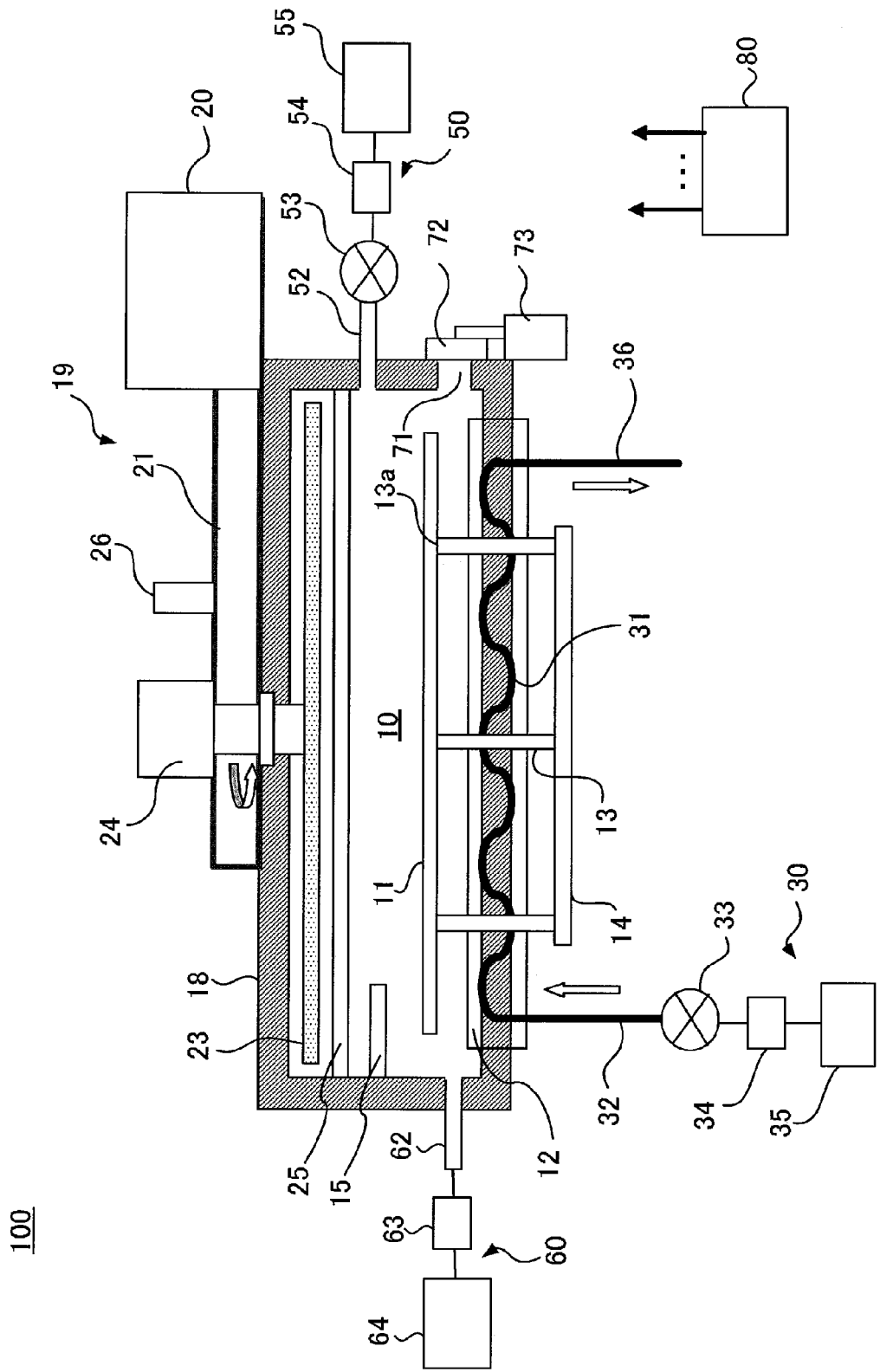
FIG. 1 is a vertical cross-sectional view of a substrate processing apparatus in accordance with an embodiment of the present invention.

Since a high-k material such as a HfO film contains a large amount (several %) of impurities such as CH, OH, and so on, resulting from an organic material, the high-k material has an insufficient electric insulating property in this state. In order to secure an electrical insulating property and stability of a thin film, attempts to perform a high speed annealing processing of the HfO film at about 650° C. to 800° C. under an oxygen ($O_2$) or nitrogen ($N_2$) atmosphere and separate impurities such as carbon (C) or hydrogen (H) from the film to modify the film into a densified stable insulating thin film have been made. While the densification does not reach crystallization, the densification is performed to reduce an average interatomic distance in an amorphous state. In the high speed annealing processing, in order to modify the HfO film, the entire substrate is heated to a high temperature.

Meanwhile, in recent semiconductor devices, a thin junction due to miniaturization is advanced, and a reduction in thermal budget (thermal history) is required. For this reason, in the above-described high-k film forming process, separation of impurities and densification with a small thermal budget are required.

In addition, in order to realize high-k characteristics of the high-k film, in particular, a cubical or tetragonal crystallization is required. This is because a specific permittivity of the high-k film depends on a crystalline structure thereof.

For example, in the case of a capacitor of a DRAM, while a high-k film is formed on a titanium nitride film, which is a lower electrode, all raw materials constituting the high-k film cannot be completely oxidized due to incapability in oxidation of an oxidizing agent, imperfection of process conditions, low temperature requirements, or the like. In addition, since oxygen is liberated when crystallization annealing is performed to improve specific permittivity of the high-k film, defects in the film such as a deficit of oxygen in the high-k film or remaining of carbon (C) may occur. As current flows through the defects in the film, a leakage current of the capacitor may be increased or the capacitor may be degraded. Further, when optimization of the crystallization annealing is insufficient to control the crystalline structure of the high-k film, i.e., when the crystalline structure is not in the cubical or tetragonal crystallization state, it is impossible to realize a specific permittivity required as a crystalline phase having a relatively low permittivity becomes predominant, and generation of large crystal grains may cause an increase in leakage current.

Furthermore, annealing of the substrate using an electric circuit formed of a heat-sensitive metal material may be considered. When the entire substrate is heated by the annealing processing, the metal material may also be heated to cause oxidation or film exfoliation of the metal material. In addition, an active species injected into the substrate may be diffused. Hereinafter, an apparatus and method for solving the above problems will be described.

First Embodiment

A configuration of a substrate processing apparatus in accordance with a first embodiment of the present invention will be described with reference to FIG. 1. FIG. 1 is a vertical cross-sectional view of the substrate processing apparatus in accordance with the first embodiment of the present invention. The substrate processing apparatus 100 includes a process chamber 10, a transfer chamber (not shown), and a microwave supply unit 19. The process chamber 10 processes a wafer 11, which is a semiconductor substrate. The microwave supply unit 19 includes a microwave generating unit 20, a waveguide 21, and a waveguide hole 22 (see FIG. 2).

<Microwave Generating Unit>

Figure 2:
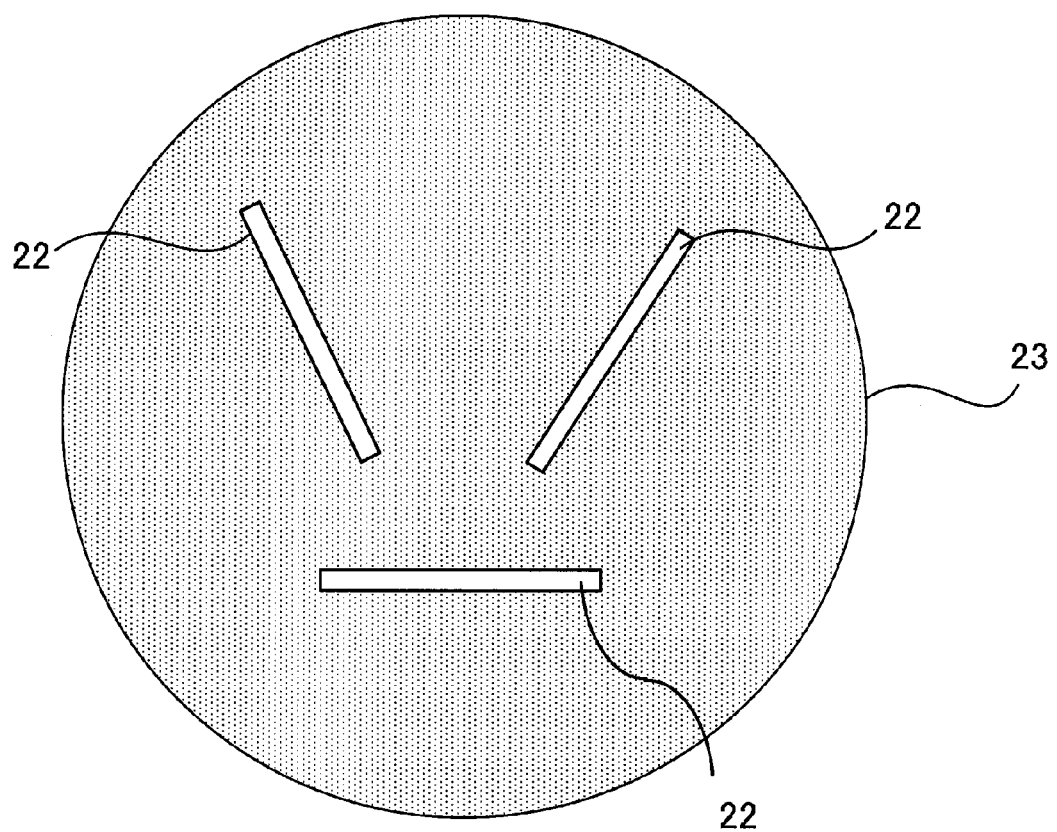
FIG. 2 is a view showing a slot-type antenna in accordance with an embodiment of the present invention.

The microwave generating unit 20 generates, for example, fixed frequency microwaves. For example, a microtron, a klystron, or a gyrotron is used as the microwave generating unit 20. Microwaves generated from the microwave generating unit 20 are radiated into the process chamber from the waveguide hole 22 installed at a slot-type antenna 23 formed of a metal material, which is a microwave radiating unit, via the waveguide 21. A matching mechanism 26 configured to reduce a reflective power in the waveguide 21 is installed at the waveguide 21. The slot-type antenna 23 is connected to a rotary mechanism 24, and a control unit 80 controls the rotary mechanism 24 to rotate the slot-type antenna 23. The slot-type antenna 23 has, for example, a shape as shown in FIG. 2. FIG. 2 is a view of the slot-type antenna 23 when seen from a lower side (a wafer side). The waveguide hole 22 has a slot shape and may be installed in plural. The slot-type antenna 23 may be rotated to uniformly irradiate microwaves toward a surface of the wafer 11.

The microwaves supplied into the process chamber 10 are irradiated toward the wafer 11. The microwaves reaching the wafer 11 in the process chamber 10 are absorbed into the wafer 11, and the wafer 11 is dielectrically heated by the microwaves. The microwave generating unit 20, the waveguide 21, the slot-type antenna 23 including the waveguide hole 22, the rotary mechanism 24, and the matching mechanism 26 constitute the microwave supply unit 19.

<Process Chamber>

A process vessel 18 constituting the process chamber 10 is formed of a metal material such as aluminum (Al) or stainless steel (SUS), and is configured to shield the process chamber 10 and the outside thereof from the microwaves.

<Substrate Support Unit>

A substrate support pin 13, which is a substrate support mechanism configured to support the wafer 11, is installed in the process chamber 10. Specifically, the wafer 11 is supported at an upper end of the substrate support pin 13. The substrate support pin 13 is installed such that a center of the supported wafer 11 substantially coincides with a center of the process chamber 10 in a vertical direction.

The substrate support pin 13 is formed of a material having low conductivity and a high electrical insulating property such as quartz, ceramics, sapphire or Teflon (registered mark). As a result, self-heating of the substrate support pin 13 can be reduced, and heat loss from the wafer 11 to the substrate support pin 13 can also be reduced. Since the heat loss can be reduced, the inside of the substrate surface can be uniformly heated. In addition, since heating of the substrate support pin 13 can be blocked to prevent thermal deformation of the substrate support pin 13 and variation in height of the wafer caused by the thermal deformation can be uniformized, the wafer adjacent to one slot can be heated with good reproducibility.

The substrate support pin 13 may be provided in plural (three in this embodiment), and support the wafer 11 at an upper end thereof.

Each of the substrate support pins 13 is mounted on a base plate 14. The base plate 14 includes a position control mechanism (not shown), and is configured to move vertically by the position control mechanism controlled by the control unit 80 and also stop the substrate support pin 13 at a specific position. As the base plate 14 is moved vertically, the substrate support pin 13 can also be moved vertically together with the base plate 14.

The substrate support pin 13 may maintain the wafer 11, for example, at a position where a distance of the wafer 11 from a surface of a substrate support table 12 is ¼ wavelength ($\lambda/4$) of the microwaves or an odd multiple of $\lambda/4$. In other words, a distance between a substrate placing surface of an upper end 13a of the substrate support pin 13 and the surface of the substrate support table 12 may be a distance of ¼ wavelength (λ/4) or an odd multiple of λ/4. As a result, when the microwaves passed through the substrate from an upper side of the substrate are reflected by the surface of the substrate support table 12 to be returned to the substrate surface, weakening of a microwave field due to interference with the microwaves entering from above the substrate can be avoided. In other words, influence of standing waves on the substrate can be reduced.

In addition, the substrate support pin 13 may maintain the wafer 11 at a position where a distance between a surface facing the substrate support table 12 in the slot-type antenna 23 and the substrate is ¼ wavelength (λ/4) of the microwaves or an odd multiple of λ/4. In other words, a distance between the facing surface and the substrate placing surface of the upper end 13a of the substrate support pin 13a may be ¼ wavelength (λ/4) of the microwaves or an odd multiple of λ/4. As a result, a high frequency electric field at the substrate surface can be maximized to efficiently introduce microwave energy into the substrate surface.

The substrate support table 12 having conductivity, which is a substrate cooling unit, is installed under the upper end 13a of the substrate support pin 13 and under the wafer 11. The substrate support table 12 is formed of a conductive material such as aluminum (Al) or silicon carbide (SiC). The substrate support table 12 has a disc shape or a cylindrical shape having a circular cross-section larger than an outer diameter of the wafer 11 when seen from an upper surface thereof.

Since the substrate support table 12 is a conductor, a potential of the microwaves on the substrate support table 12 becomes zero. Accordingly, when the wafer 11 is directly placed on the substrate support table 12, strength of the electric field of the microwaves is in a weak state. Therefore, in this embodiment, as the substrate support pin 13 is moved, the wafer 11 is placed at a position of ¼ wavelength (λ/4) or an odd multiple of λ/4 from the surface of the substrate support table 12. Here, the surface of the substrate support table 12 refers to a surface facing a rear surface of the wafer in the surface constituting the substrate support table 12. Since the electric field is strong at the position of the odd multiple of λ/4, the wafer 11 can be efficiently heated by the microwaves. In this embodiment, since microwaves fixed to, for example, 5.8 GHz are used and a wavelength of the microwaves is 51.7 mm, a height of the wafer 11 from the substrate support table 12 is 12.9 mm.

In addition, since the substrate support table 12, which is a conductor, does not consume the microwave energy at the surface of the substrate support table 12, the wafer 11 can be efficiently heated by the microwaves reflected from the substrate support table 12. Here, the substrate support table 12 and the substrate support pin 13 constitute the substrate support unit.

<Cooling Unit>

A coolant flow path 31 is installed in the substrate support table 12 to flow coolant to cool the wafer 11. In this embodiment, while water is used as the coolant, another coolant such as a cooling chiller may be used. The coolant flow path 31 is configured to be connected to a coolant supply pipe 32 configured to supply coolant into the coolant flow path 31 from the outside and a coolant discharge pipe 36 configured to discharge the coolant from the coolant flow path 31 to flow the coolant in an arrow direction. An opening/closing valve 33 configured to open/close the coolant supply pipe 32, a flow rate control device 32 configured to control a flow rate of the coolant, and a coolant source 35 are installed at the coolant supply pipe 32 in sequence from a downstream thereof. The opening/closing valve 33 and the flow rate control device 34 are electrically connected to the control unit 80 and controlled by the control unit 80. The coolant flow path 31, the coolant supply pipe 32, the opening/closing valve 33, the flow rate control device 34, and the coolant discharge pipe 36 constitute the cooling unit 30.

<Partition>

Since the rotary mechanism 24 has a mechanical structure and the slot-type antenna 23 is formed of a metal material, during rotation of the slot-type antenna 23, the metal material may be exfoliated due to contact with parts or overheating and thus may cause metal contamination of the wafer. In addition, since the rotary mechanism includes complex mechanisms, it is difficult to hermetically seal the process chamber 10.

Therefore, a partition 25 is installed between the substrate support table 12 and the slot-type antenna 23 and at a position higher than a gas supply pipe 52. The partition 25 is installed to contact an inner wall of the process vessel 18 to partition the process chamber 10.

The partition 25 is formed of a material through which microwaves penetrate. In other words, the material is a conductive material having a small loss coefficient of the microwaves, for example, quartz or ceramics. As the partition 25 is formed of a material having a small loss coefficient, the microwaves in a state of a small energy loss can be irradiated onto the wafer 11.

<Temperature Detector>

A temperature detector 15 configured to detect a temperature of the wafer 11 is installed over the wafer 11 in the process chamber 10. An infrared sensor, for example, may be used as the temperature detector 15. The temperature detector 15 is electrically connected to the control unit 80. When a temperature of the wafer 11 detected by the temperature detector 15 is higher than a predetermined temperature, the control unit 80 controls the opening/closing valve 33 and the flow rate control device 34 such that the temperature of the wafer 11 reaches the predetermined temperature, and adjusts a flow rate of the cooling water flowing through the coolant flow path 31.

<Gas Supply Unit>

The gas supply pipe 52 configured to supply a gas such as nitrogen ($N_2$) is installed on the sidewall of the process chamber 10 at a position lower than the partition 25. A gas supply source 55, a flow rate control device 54 configured to regulate a flow rate of a gas, and a valve 53 configured to open and close a gas flow path are installed at the gas supply pipe 52 in sequence from an upstream thereof. As the valve 53 is opened and closed, the gas is supplied into the process chamber 10 from the gas supply pipe 52 or the gas supply is stopped. The gas supplied from the gas supply pipe 52 is used to cool the wafer 11 or acts as a purge gas to purge the gas or atmosphere in the process chamber 10. The gas supply source 55, the gas supply pipe 52, the flow rate control device 54, and the valve 53 constitute the gas supply unit 50. The flow rate control device 54 and the valve 53 are electrically connected to the control unit 80 and controlled by the control unit 80.

<Gas Exhaust Unit>

As shown in FIG. 1, a gas exhaust pipe 62 configured to exhaust the gas in the process chamber 10 is installed at the sidewall of the process chamber 10, which is a lower part of the process vessel 18 having, for example, a rectangular parallelepiped shape. A pressure regulation valve 63 and a vacuum pump 64, which is an exhaust apparatus, are installed at the gas exhaust pipe 62 in sequence from an upstream thereof. As an opening angle of the pressure regulation valve 63 is adjusted, the pressure in the process chamber 10 is regulated to a predetermined value. The gas exhaust pipe 62, the pressure regulation valve 63, and the vacuum pump 64 constitute a gas exhaust unit 60. The pressure regulation valve 63 and the vacuum pump 64 are electrically connected to the control unit 80 and controlled by the control unit 80 to regulate the pressure.

<Wafer Transfer Unit>

As shown in FIG. 1, a wafer transfer port 71 configured to transfer the wafer 11 to an inside and outside of the process chamber 10 is installed at one side surface of the process vessel 18. A gate valve 72 is installed at the wafer transfer port 71. As the gate valve 72 is opened by a gate valve drive unit 73, the inside of the process chamber 10 is configured to be in communication with an inside of a transfer chamber. The wafer transfer port 71, the gate valve 72, and the gate valve drive unit 73 constitute a wafer transfer unit. A transfer robot (not shown) configured to transfer the wafer 11 is installed in the transfer chamber. The transfer robot includes a transfer arm configured to support the wafer 11 when the wafer 11 is transferred. As the gate valve 72 is opened, the wafer 11 can be transferred between the inside of the process chamber 10 and the inside of the transfer chamber by the transfer robot.

<Control Unit>

The substrate processing apparatus 100 includes the control unit 80 configured to control operations of the respective components of the substrate processing apparatus 100. The control unit 80 controls the operations of the components such as the microwave generating unit 20, the gate valve drive unit 73, the transfer robot, the flow rate control devices 54 and 34, the valves 53 and 33, the pressure regulation valve 63, and so on.

Figure 3:
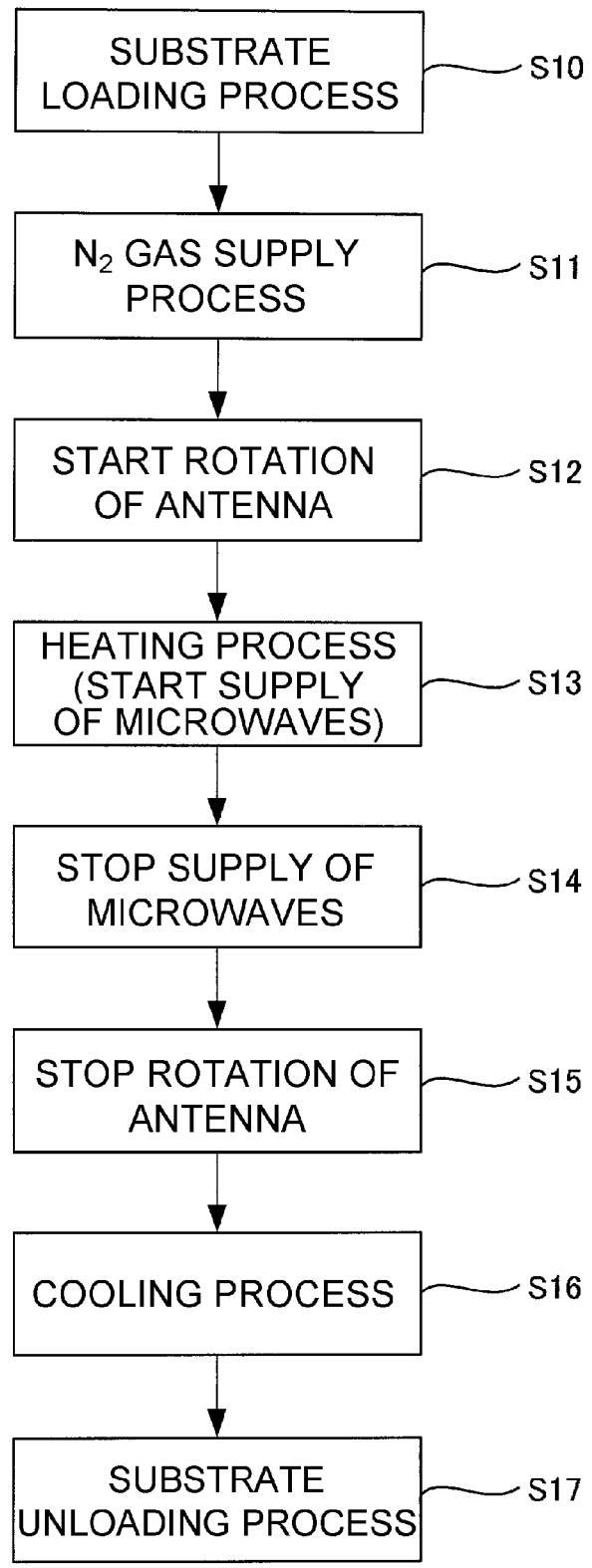
FIG. 3 is a flowchart of a substrate processing process in accordance with an embodiment of the present invention.
Figure 4:
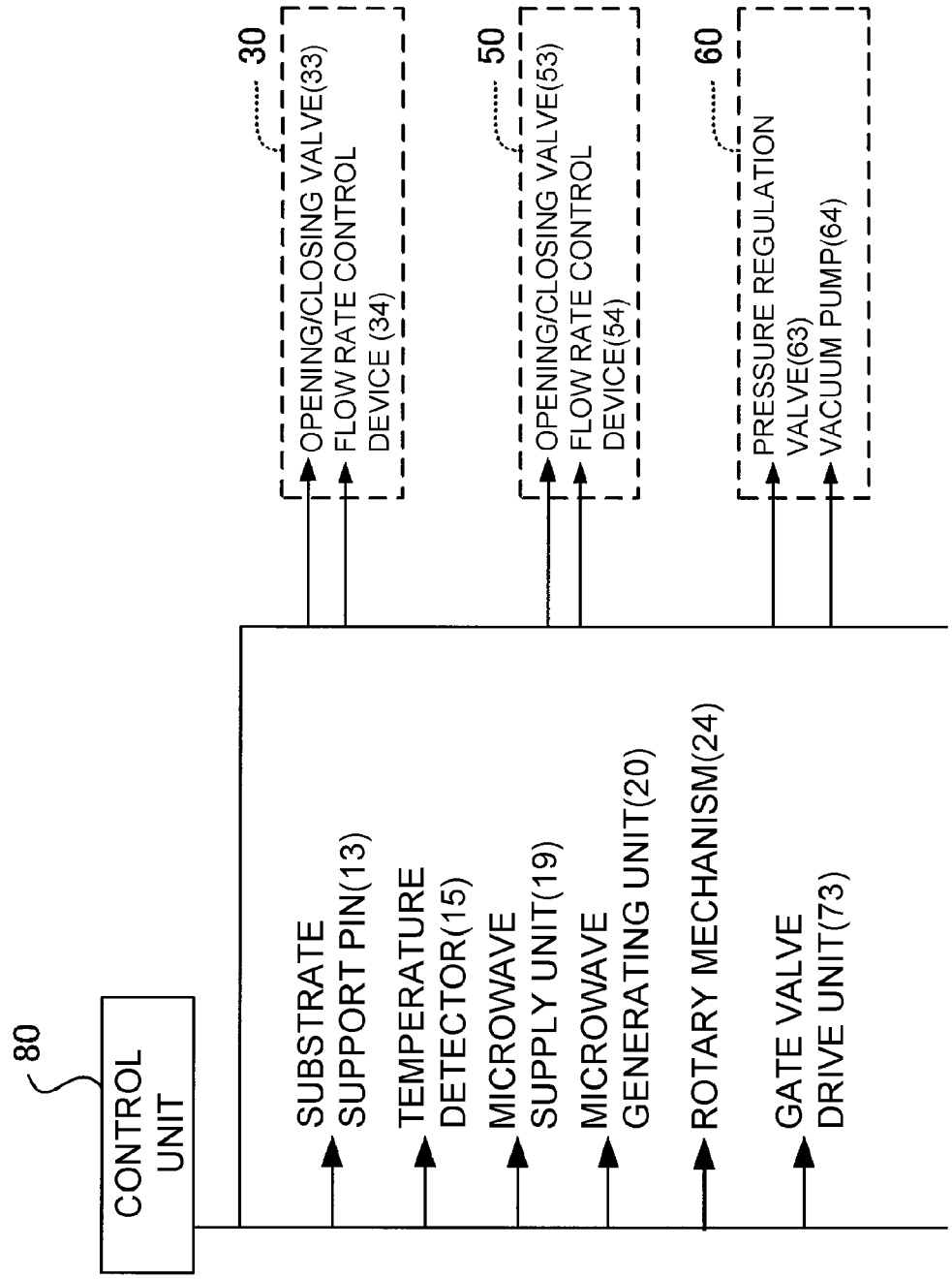
FIG. 4 is a block diagram showing a control configuration of the substrate processing apparatus in accordance with an embodiment of the present invention.

Hereinafter, a substrate processing operation of the embodiment in the substrate processing apparatus 10 will be described. FIG. 3 is a flowchart of a substrate processing process in accordance with an embodiment of the present invention. FIG. 4 is a block diagram showing a control configuration of the substrate processing apparatus in accordance with an embodiment of the present invention. In addition, substrate processing of the embodiment configures one of a plurality of processes of manufacturing a semiconductor device. Further, the following operations of the respective units are controlled by the control unit 80.

<Substrate Loading Process (Step S10)>

In a substrate loading process of loading the wafer 11 into the process chamber 10, first, the gate valve 72 is opened, and the process chamber 10 is communicated with the transfer chamber. Next, the wafer to be treated 11 is loaded into the process chamber from the transfer chamber by the transfer robot. The wafer 11 loaded into the process chamber 10 is placed on the upper end 13a of the substrate support pin 13 by the transfer robot and supported by the substrate support pin 13. Next, when the transfer robot is returned into the transfer chamber from the process chamber 10, the gate valve 72 is closed.

<Nitrogen Gas Supply Process (Step S11)>

Next, the inside of the process chamber 10 is substituted with a nitrogen ($N_2$) atmosphere. When the wafer 11 is loaded, since the atmosphere outside the process chamber is introduced, the inside of the process chamber 10 is substituted with the $N_2$ atmosphere to prevent influence of moisture or oxygen in the atmosphere on the process. The $N_2$ gas is supplied into the process chamber 10 from the gas supply pipe 52 while the gas (atmosphere) in the process chamber 10 is discharged from the gas exhaust pipe 62 by the vacuum pump 64. At this time, the pressure in the process chamber 10 is regulated by the pressure regulation valve 63 to a predetermined value, i.e., an atmospheric pressure, which is a pressure at which plasma is not generated in this embodiment. If the microwaves are supplied in a state in which the pressure in the process chamber is substantially lower than the atmospheric pressure, the plasma is generated in the process chamber. Since the plasma has a property of reflecting the microwaves, advance of the microwaves to the substrate surface is obstructed. Therefore, in order to reduce generation of the plasma in the process chamber, a pressure in a cavity should be the atmospheric pressure or more.

Next, the slot-type antenna 23 is rotated (Step S12).

<Heat Treatment Process (Start Supply of Microwaves, Step S13)>

When a rotational speed of the slot-type antenna 23 is uniformized, the microwaves generated from the microwave generating unit 20 are supplied into the process chamber 10 from the waveguide hole 22, and irradiated from the surface side of the wafer 11. At this time, the wafer is maintained at a position (first position) of ¼ wavelength ($\lambda/4$) of the microwaves from the surface of the substrate support table 12 or an odd multiple of $\lambda/4$. A frequency of the microwaves is set to a desired frequency ranging from 1 GHz to 8 GHz. As the microwaves are irradiated, the high-k film on the surface of the wafer 11 is heated to 100° C. to 600° C. to perform modification processing of the high-k film, i.e., impurities such as C or H are separated from the high-k film to modify the high-k film into a densified and stable insulating thin film.

In a dielectric substance such as the high-k film, an absorption rate of the microwaves is different depending on permittivity. As permittivity of the dielectric substance is increased, the microwaves are easily absorbed. According to research of the inventor(s), it was confirmed that, when high power microwaves are irradiated to the wafer, a dielectric film on the wafer is heated and modified. In addition, according to characteristics of the heating by the microwaves, it was confirmed that, in dielectric heating by permittivity $\in$ and dielectric tangent tan $\delta$, when materials having different properties are simultaneously heated, only a material to be easily heated, i.e., a material having high permittivity, can be selectively heated to a higher temperature.

Hereinafter, annealing of the high-k film will be described. The high-k film has a higher permittivity $\in$ than silicon, which is a substrate material of the wafer. For example, while a specific permittivity $\in r$ of silicon is 3.9, a specific permittivity $\in r$ of an HfO film, which is a high-k film, is 25, and a specific permittivity $\in r$ of a ZrO film is 35. Accordingly, when the microwaves are irradiated to the wafer on which the high-k film is formed, the high-k film is selectively heated to a higher temperature. In addition, of course, a temperature difference between the silicon and the high-k film is attenuated by heat transfer.

According to the research of the inventor(s), a modification effect of the film to which high power microwaves are irradiated is larger than in low power microwaves. When the high power microwaves are irradiated, a temperature of the high-k film can be rapidly increased. In addition, when relatively low power microwaves are irradiated for a long time, a temperature of the entire wafer is increased during a modification process. This is because the silicon itself is dielectrically heated by the microwaves as time elapses, and the temperature of the silicon is increased by heat conduction from the high-k film of the wafer surface, to which the microwaves are irradiated, to the silicon at the rear surface of the wafer. The modification effect of the film is considered to increase when the high power microwaves are irradiated because the dielectric substance can be heated to a higher temperature by dielectric heating within a time until the temperature of the entire wafer is increased to an upper limit temperature. For example, in the case of the HfO film, even when the wafer temperature during modification is about 400° C., since a ground temperature is further increased, the film should be cooled to reduce an increase in temperature.

Therefore, in this embodiment, during irradiation (supply) of the microwaves, the cooling water, which is a coolant, is supplied into the coolant flow path 31 to reduce an increase in temperature of the wafer 11. Preferably, until the temperature of the wafer 11 reaches a predetermined temperature, the opening/closing valve 33 and the flow rate control device 34 are controlled to adjust a flow rate of the cooling water passing through the coolant flow path 31. As described above, as the processing temperature of the wafer 11 is uniformized, reproducibility of the process result when the plurality of wafers are processed can be improved.

In addition, in the heat treatment process, the control unit 80 opens the valve 53 to supply the $N_2$ gas into the process chamber 10 from the gas supply pipe 52, adjusts the pressure in the process chamber 10 using the pressure regulation valve 63 to a predetermined value, and in this embodiment, to the atmospheric pressure, and discharges the $N_2$ gas in the process chamber 10 from the gas exhaust pipe 62. Accordingly, in the heat treatment process, the inside of the process chamber 10 is maintained at a predetermined pressure value. In this example, the microwaves of the frequency 5.8 GHz are set to a power of 1600 W, the pressure in the process chamber 10 is set to the atmospheric pressure, and heat treatment is performed for five minutes. In addition, as the flow rate of the $N_2$ gas supplied into the process chamber 10 is controlled, cooling of the wafer 11 may be promoted.

When a cooling effect of the $N_2$ gas is actively used, by installing the gas supply pipe 52 at the substrate support table 12 and flowing the gas between the wafer 11 and the substrate support table 12, improvement in cooling effect by the gas may be promoted. As the flow rate of the gas is controlled, a temperature control of the wafer 11 may be performed.

In addition, in the case of the high-k film such as an $HfO_2$ film, a frequency bandwidth is provided in a microwave range to effectively absorb energy and use the energy to heat the film. This is generated upon reception of the electric field by the microwaves because there is a peak of a dielectric distribution by an orientation polarization among polarization phenomena, which cause the high permittivity, and a resonance type peak of ion polarization due to crystallization is varied into a lower frequency bandwidth, other than a conventional infrared range. For this reason, in particular, the high-k film can be efficiently heated by preferably selecting the frequency of the microwaves.

For example, since the peak of the dielectric distribution by the orientation polarization shows a relatively broad distribution, when several GHz of microwaves is used, a material in which a high orientation polarization is easy like the high-k film (i.e., displacement of a polarization is large) can be selectively heated. In addition, when a higher microwave range than a millimeter wave is used, effective utilization of the heating effect using ionic polarization may be promoted.

Further, when the high-k film is to be more effectively heated, a preferable frequency bandwidth can be effectively determined according to the following teachings. That is, frequency characteristics of the high-k film in dielectric attenuation are previously measured. First, an imaginary number term of the dielectric attenuation in an alternating electric field/magnetic field of the high-k film is measured. Then, a specific peak is obtained on the high-k film, which is a subject. Use of microwaves having a frequency more than ½ of the peak frequency is effective to the application.

Here, provided that a Debye-type attenuation having a sharp and steep distribution is provided, since an absorption rate of the microwaves is about a half of a saturation value at a position of the peak, and becomes a half of the half at the at ½ of the frequency, use of the microwaves having a frequency of ½ or more of the frequency of the peak when an effective heating is considered may be appropriate. In addition, since the peak of the attenuation of the high-k film is likely to be shifted toward the high frequency as the temperature increases, when the efficiency is intended to be increased after an increase in temperature upon the heating, selection of at least the peak frequency or more at room temperature, preferably, ten times or more, is effective. Further, when prevention of overheating at a high temperature is intended, on the other hand, it is effective for a lower frequency than the peak frequency to be selected and a heating efficiency after the increase in temperature is lower than before the increase in temperature.

Furthermore, while $N_2$ gas is used in this embodiment, if there is no problem in process and stability, another gas having a high heat transfer rate such as a dilute He gas may be added to the $N_2$ gas to improve a substrate cooling effect.

As a technique of improving the substrate cooling effect, during irradiation of the microwaves, the substrate support pin 13 may be lowered to maintain the wafer 11 at a second position where a distance between the wafer 11 and the substrate support table 12 is shortened. Here, the distance is, for example, 0.1 mm to 1.0 mm. Or, the wafer may be placed on the surface of the substrate support table 12. Since the distance between the wafer 11 and the substrate support table 12 is varied, while the heating efficiency by the microwaves is decreased, the cooling efficiency is increased to improve a thermal budget reducing effect. In this case, after the thermal budget is somewhat decreased, the substrate support pin 13 may be raised again to continuously heat the wafer at a position where the heating efficiency of the microwaves is high.

After the substrate heating process is performed by supplying the microwaves for a predetermined time as described above, supply of the microwaves is stopped (Step S14), and rotation of the slot-type antenna 23 is stopped (Step S15).

<Cooling Process, Step S16>

After the rotation of the slot-type antenna 23 is stopped, the substrate support pin 13 is lowered to maintain the wafer 11 for a predetermined time at a third position where a distance between the wafer 11 and the substrate support pin 12 is short. Here, the distance is, for example, 0.1 mm to 0.5 mm.

As a result, the heated wafer 11 can be rapidly cooled. Originally, when the heated wafer is moved under the atmospheric pressure, a drop in substrate temperature may take time to decrease productivity. Accordingly, since the wafer is rapidly cooled to reduce a temperature decreasing time, throughput can be increased even when the wafer is moved under the atmospheric pressure.

<Substrate Unloading Process, Step S17>

When the heat treatment process is completed, the heat-treated wafer 11 is unloaded into the transfer chamber from the process chamber 10 in a reverse sequence of the sequence described in the above substrate loading process. In this embodiment, since the wafer 11 is processed at a relatively low temperature, a wafer cooling time for cooling the wafer 11 is unnecessary and throughput is improved.

According to the first embodiment, at least one effect of the following effects may be provided: (1) the dielectric substance of the substrate surface can be modified while reducing the thermal budget of the substrate, (2) a material having high permittivity can be selectively heated, (3) the substrate cooling unit can be easily configured because the substrate support table is used, (4) the heating can be uniformized by the microwaves after the rotational speed of the slot-type antenna is uniformized, (5) the dielectric substance on the substrate surface can be efficiently heated because the electric field of the microwaves can be increased at a height position of the substrate, (6) a cooling level of the substrate can be controlled according to the process, (7) reproducibility of the process result when the plurality of substrates are processed can be improved by uniformizing the process temperature of the substrate, and (8) since the substrate is processed at a relatively low temperature, the substrate cooling time for cooling the substrate becomes unnecessary and the throughput is improved, and so on.

Second Embodiment

Next, a second embodiment will be described.

A type of an apparatus of the second embodiment uses substantially the same apparatus/process method as the first embodiment, except that the first position in the heating process is different.

In the second embodiment, the first position is located at a distance from ¼ wavelength (λ/4) of the microwaves or an odd multiple of λ/4 from a surface facing the substrate support table 12 in the slot-type antenna 23 to maintain the wafer.

At this position, strength of the electric field of the microwaves on the substrate surface is maximized to enable effective irradiation of the microwave energy to the wafer surface.

In addition, in the invention, while the substrate is cooled on the substrate support table while rotating the slot-type antenna having a microwave supply hole and supplying the microwaves, the present invention is not limited thereto but may have a structure of relatively changing (for example, rotating) positions of the substrate and the microwaves to uniformly supply the microwaves and cool the substrate.

Therefore, while the substrate is considered to be cooled by the cooling mechanism of the substrate support table while rotating the substrate support table, since the structure of rotating the substrate while flowing a cooling agent through the substrate support table may be mechanically complicated and increase costs, the microwave supply hole and the substrate may be moved relatively to each other using another component such as the slot-type antenna of the present invention, rather than the substrate support table.

The present invention is not limited to the embodiments but may be variously modified without departing from the scope of the present invention. While the wafer has been described in the embodiments as a subject to be processed, the subject to be processed may be a photo mask, a printed circuit board, a liquid crystal panel, a compact disc, a magnetic disk, and so on.

In addition, while the annealing process (crystallization control, reduction of impurities, supplement of oxygen vacancy) of the wafer having a high-k film like the embodiment has been described, the embodiment is not limited thereto but may be applied to activation of impurities injected into a bare silicon substrate, control of activation of poly-Si and crystallization shape, curing of polymer, control of a grain size of Cu interconnection, recovery of deficit of Epi-Si or Epi-SiGe, or crystallization of a poly structure. In an LED process, the embodiment may be applied to the substrate processing apparatus and the method of manufacturing the substrate to improve a crystalline property of GaN.

In addition, in this embodiment, while the wafer is processed with the frequency of the microwaves fixed, the frequency of the microwaves is not limited thereto but may be changed (varied) with time. In this case, the height from the surface of the substrate support table 12 to the wafer 11 may be obtained from a wavelength of a representative frequency of the varying frequency range. For example, when the wavelength is varied from 5.8 GHz to 7.0 GHz, the representative frequency may be a center frequency of the varying frequency bandwidth, and, from the wavelength (46 mm) of the representative frequency of 6.4 GHz, the height from the surface of the substrate support table 12 to the wafer 11 may be 11.5 mm.

In addition, a plurality of power supplies having a fixed frequency may be installed, and the microwaves having different frequencies may be switched and supplied from the power supplies or the microwaves having the different frequencies may be simultaneously supplied.

<Supplementary Note 1>

A substrate processing apparatus including: a process chamber configured to process a substrate; a substrate support unit installed in the process chamber to support the substrate; a microwave supply unit configured to supply microwaves toward a surface of the substrate supported by the substrate support unit; a partition installed between the microwave supply unit and the substrate support unit; a cooling unit installed at the substrate support unit; and a control unit configured to control at least the substrate support unit, the microwave supply unit, and the cooling unit.

<Supplementary Note 2>

The substrate processing apparatus according to Supplementary Note 1, wherein the partition is formed of a material through which the microwaves can pass (quartz).

<Supplementary Note 3>

The substrate processing apparatus according to Supplementary Note 1, wherein the microwave supply unit includes a microwave radiating unit (a slot-type antenna) configured to radiate the microwaves to the process chamber, and the microwave radiating unit is configured to be rotated.

<Supplementary Note 4>

The substrate processing apparatus according to Supplementary Note 1, wherein the substrate support unit includes a substrate support mechanism and a substrate support table configured to support the substrate, wherein the substrate support mechanism is vertically movable such that a distance between an upper end of the substrate support mechanism and a surface of the substrate support table (a surface facing the substrate) is an odd multiple of ¼ wavelength of the microwaves.

<Supplementary Note 5>

The substrate processing apparatus according to Supplementary Note 1, wherein the substrate support unit includes a substrate support mechanism configured to support the substrate, and a distance between a surface facing the substrate support unit in the antenna and the substrate support unit is controllable by a distance corresponding to an odd multiple of ¼ wavelength.

<Supplementary Note 6>

The substrate processing apparatus according to Supplementary Note 1, wherein the substrate support unit includes a substrate support table configured to support the substrate, and the substrate support table includes a high conductive material.

<Supplementary Note 7>

The substrate processing apparatus according to Supplementary Note 1, wherein the substrate support unit includes a substrate support mechanism configured to support the substrate, and the substrate support mechanism including a low heat conductive insulating material.

The substrate processing apparatus according to Supplementary Note 4, wherein the control unit controls a distance between an upper end of the substrate support mechanism and a surface of the substrate support table to be a first distance corresponding to an odd multiple of ¼ wavelength of the supplied microwaves while the microwaves are supplied from the microwave supply unit, and to be shorter than the first distance after stopping supply of the microwaves.

The substrate processing apparatus according to Supplementary Note 4, wherein the control unit controls a distance between an upper end of the substrate support mechanism and the facing surface to be a first distance corresponding to an odd multiple of ¼ wavelength of the supplied microwaves while the microwaves are supplied from the microwave supply unit, and a distance between the upper end of the substrate support mechanism and the surface of the substrate support table to be shorter than the first distance in a state in which the microwaves are supplied.

A method of manufacturing a semiconductor device in a substrate processing apparatus including: a process chamber configured to process a substrate; a substrate support unit installed in the process chamber to support the substrate; a microwave supply unit configured to supply microwaves toward a surface of the substrate supported by the substrate support unit; a partition installed between the microwave supply unit and the substrate support unit; a cooling unit installed at the substrate support unit; and a control unit configured to control at least the substrate support unit, the microwave supply unit, and the cooling unit, the method including: loading the substrate supported by the substrate support unit; supplying the microwaves from the microwave supply unit; and supplying a coolant into the cooling unit while the microwaves are supplied.

<Supplementary Note 8>

A substrate processing apparatus including: a process chamber configured to process a substrate; a substrate support unit installed in the process chamber to support the substrate; a microwave supply unit configured to supply a microwave toward a process surface of the substrate supported by the substrate support unit, the microwave supply unit including a microwave radiating unit (a slot-type antenna) radiating the microwave supplied from a microwave source to the process chamber while rotating; a partition installed between the microwave supply unit and the substrate support unit; a cooling unit installed at the substrate support unit; and a control unit configured to control at least the substrate support unit, the microwave supply unit and the cooling unit. Accordingly, since the microwave radiating unit can be rotated to uniformly irradiate the microwaves to a film formed on the substrate surface, the substrate can be uniformly heated.

<Supplementary Note 9>

The substrate processing apparatus according to Supplementary Note 8, wherein the substrate support unit includes a substrate support mechanism and a substrate support table configured to support the substrate, wherein the substrate support mechanism is vertically movable such that a distance between an upper end of the substrate support mechanism and a surface of the substrate support table is an odd multiple of ¼ wavelength of the microwaves. Accordingly, since the substrate can be positioned at the peak of the microwaves (an apex of the waveform), the heating efficiency is good. When the heating efficiency is good, another film may also be heated by heat conduction from a high-k film. However, as the substrate support table including the cooling unit and formed of a conductive material is disposed under the substrate, heating of the film other than the high-k film can be reduced.

<Supplementary Note 10>

The substrate processing apparatus according to Supplementary Note 8, wherein the substrate support unit includes a substrate support mechanism configured to support the substrate, wherein the substrate support mechanism is vertically movable such that a distance between a surface facing the substrate support unit in the microwave radiating unit and the substrate support unit is an odd multiple of ¼ wavelength. Accordingly, since the substrate can be positioned at the peak of the microwaves (an apex of the waveform), the heating efficiency is good. In particular, since direct waves of the microwaves are irradiated to the substrate, the microwaves, which are not deteriorated, can be supplied to thereby efficiently heat the substrate.

<Supplementary Note 11>

The substrate processing apparatus according to Supplementary Note 8, wherein the substrate support unit includes a substrate support table configured to support the substrate, wherein the substrate support table includes a high conductive material. Accordingly, a high cooling effect can be obtained.

<Supplementary Note 12>

The substrate processing apparatus according to Supplementary Note 8, wherein the substrate support unit includes a substrate support mechanism configured to support the substrate, the substrate support mechanism including a low heat conductive insulating material. Since the mechanism is formed of a low heat conductive material, heat loss to a substrate support pin can be prevented, and thus, the substrate can be uniformly heated.

<Supplementary Note 13>

The substrate processing apparatus according to Supplementary Note 9, wherein the control unit controls a distance between an upper end of the substrate support mechanism and a surface of the substrate support table to be a first distance corresponding to an odd multiple of ¼ wavelength of the supplied microwaves while supplying the microwaves from the microwave supply unit, and to be shorter than the first distance after stopping the supply of the microwaves. Accordingly, a heated wafer can be rapidly cooled. Originally, when the heated wafer is moved under the atmospheric pressure, a drop in substrate temperature may take time and productivity may be decreased. Therefore, as the substrate is cooled rapidly to reduce the temperature drop time, throughput can be increased even when the wafer is moved under the atmospheric pressure.

<Supplementary Note 14>

The substrate processing apparatus according to Supplementary Note 9, wherein the control unit controls a distance between an upper end of the substrate support mechanism and a surface of the substrate support table to be a first distance corresponding to an odd multiple of ¼ wavelength of the supplied microwaves while supplying the microwaves from the microwave supply unit, and to be shorter than the first distance in a state in which the microwaves are supplied. Accordingly, since the cooling efficiency is increased, a thermal budget reduction effect is increased.

<Supplementary Note 15>

A method of manufacturing a semiconductor device using a substrate processing apparatus including: a substrate support unit installed in the process chamber to support the substrate; a microwave supply unit configured to supply a microwave toward a process surface of the substrate supported by the substrate support unit, the microwave supply unit including a microwave radiating unit (a slot-type antenna) radiating the microwave supplied from a microwave source to the process chamber while rotating; a partition installed between the microwave supply unit and the substrate support unit; a cooling unit installed at the substrate support unit; an inert gas supply unit configured to supply an inert gas into the process chamber, and a control unit configured to control at least the substrate support unit, the microwave supply unit, the cooling unit, and the inert gas supply unit, the method including: placing the substrate on the substrate support unit and supplying the inert gas from the inert gas supply unit; rotating the microwave radiating unit and supplying the microwave into the process chamber after supplying the inert gas; and stopping supplying the microwave after the microwave is supplied. After a rotational speed of the antenna is uniformized, the substrate can be uniformly heated using the microwaves.

<Supplementary Note 16>

The method according to Supplementary Note 15, the substrate support unit comprises a substrate support mechanism and a substrate support table configured to support the substrate, the control unit controls a distance between an upper end of the substrate support mechanism and a surface of the substrate support table to be a first distance corresponding to an odd multiple of ¼ wavelength of the microwave while supplying the microwave from the microwave supply unit, and to be shorter than the first distance after stopping supplying the microwaves. Accordingly, a heated wafer can be rapidly cooled. Originally, when the heated wafer is moved under the atmospheric pressure, a drop in substrate temperature may take time and productivity may be decreased. Therefore, as the wafer is rapidly cooled to reduce the temperature drop time, throughput can be increased even when the wafer is moved under the atmospheric pressure.

What is claimed is:

1. A method of manufacturing a semiconductor device using a substrate processing apparatus comprising: a process chamber configured to process a substrate; a substrate support unit installed in the process chamber to support the substrate, the substrate support unit comprising a substrate support mechanism and a substrate support table wherein an upper end of the substrate support mechanism supports the substrate; a microwave supply unit including a microwave radiating unit radiating a microwave supplied from a microwave source to the substrate, wherein the microwave radiating unit supplies the microwave toward a process surface of the substrate supported by the substrate support unit while rotating; a cooling unit installed at the substrate support table; an inert gas supply unit configured to supply an inert gas into the process chamber; and a control unit configured to control the substrate support unit, the microwave supply unit, the cooling unit and the inert gas supply unit, the method comprising:

(a) placing the substrate on the substrate support unit and supplying the inert gas from the inert gas supply unit;

(b) rotating the microwave radiating unit and supplying the microwave into the process chamber after supplying the inert gas; and (c) cooling down the substrate by using the cooling unit and by stopping supply of the microwave, wherein the substrate support mechanism is moved in a manner that a distance between the upper end of the substrate support mechanism and a surface of the substrate support table is a first distance while the substrate is heated by the microwave supplied in the step (b), and that the distance is a second distance shorter than the first distance while the substrate is cooled by the cooling unit in the step (c).

2. The method according to claim 1, wherein the substrate support mechanism is moved in a manner that the distance between the upper end of the substrate support mechanism and the surface of the substrate support table is an odd multiple of ¼ wavelength of the microwave in the step (b).

3. The method according to claim 1, wherein the substrate support mechanism comprises a low heat conductive insulating material.

4. The method according to claim 1, wherein the substrate support table comprises a conductive material.

* * * * *